US005204501A

United States Patent [19]

Tsao

[11] Patent Number: 5,204,501

[45] Date of Patent: Apr. 20, 1993

[54] SYNCHRONOUS COMMON POLAR RESONANT WALL TYPE SPEAKER CABINET

[76] Inventor: Ye-Ming Tsao, 6F-4, No. 188, Sec. 3 Ting-Chou Rd., Taipei, Taiwan

[21] Appl. No.: 838,343

[22] Filed: Feb. 20, 1992

[51] Int. Cl.[5] ............................................ H05K 5/00

[52] U.S. Cl. .................................. 181/156; 181/199

[58] Field of Search .................... 181/148, 152, 155, , 181/156, 160, 199; 381/88, 90, 159

[56] References Cited

U.S. PATENT DOCUMENTS

| | | | |
|---|---|---|---|
| 2,097,287 | 10/1937 | Olson | 181/156 |
| 2,713,396 | 7/1955 | Tavares | 181/155 |
| 4,413,703 | 11/1983 | Kato et al. | 181/156 |
| 4,618,025 | 10/1986 | Sherman | 181/148 |

*Primary Examiner*—Michael L. Gellner
*Assistant Examiner*—Khanh Dang
*Attorney, Agent, or Firm*—Bacon & Thomas

[57] ABSTRACT

A synchronous common polar resonant wall type speaker cabinet comprises a speaker fixed to its front board, and one or more resonance means on the other wall boards, in which each resonance means includes an air pressure compensation chamber surrounded by a rigid conductive hood, a compensation resonance chamber surrounded by a rigid wall board, a resonance plate between the air pressure compensation chamber and the compensation resonance chamber, a soft expansion gasket located between the resonance plate and the rigid conductive hood, and another soft expansion gasket between the rigid conductive hood and the rigid back board so that the resonance plate can oscillate by changing of air pressure in the air pressure compensation chamber, and hence a surrounding sound effect superior to that available from matrix speaker system is obtained with only a speaker without any increase of driving power.

2 Claims, 4 Drawing Sheets

SYNCHRONOUS COMMON POLAR RESONANT WALL TYPE SPEAKER CABINET

BACKGROUND OF THE INVENTION

The present invention relates to a synchronous common polar resonant wall type speaker cabinet, particularly use of a kinetic energy which will be vanished in the cabinet to drive one or more resonance means for regenerating energy to emphasize the sound effect.

Sound is generated by oscillation of substance. When a substance is oscillating, a continuous wave is generated in its ambient air, and the wave is a mechanical longitudinal wave to propagate sound energy. In the conventional speaker cabinet, a conical part (resonance plate) is oscillating to regenerate sound. Under the same driving power, the larger the surface area of the conical part, the higher the bass pressure. Hence, for a good bass effect, a large speaker is required, and also a considerable large cabinet is required. Then, compact speaker cabinet with outstanding bass effect for family to minimize space requirement is a concern of the speaker industry today.

Speaker system is indispensable for conversion of electronic signal from electronic amplifier to radiative sound with high fidelity. Therefore, improvement of tone and sound effect from speaker is a direction of research and development in the field of electronic audio equipment, particularly for speaker system with surrounding sound effect.

Conventional, a matrix speaker system comprising of a plurality of speakers (speaker cabinets) is used to provide surrounding sound effect. In such a system, each speaker provides indeed a narrow radiating sound field to a certain direction, and all these speakers together provide a broad and dispersive surrounding sound effect.

However, the cost of such a matrix speaker system is relatively high because a number of speakers is required. Moreover, matrix arrangement of such speakers is quite difficult, and even not possible by ordinary person. Skilled person in the art is needed for its installation, and hence, cost of installation is quite high. Moreover, due to mutual interference of the narrow radiating sound fields, distortion happens, and regeneration of sound at high fidelity is not possible. Therefore, it is not an ideal equipment to generate surrounding sound effect.

As described above, there is a need by most of people and electronics industries that of simple and low-cost speaker which can regenerate sound at high fidelity with surrounding sound effect and high quality bass and tone.

SUMMARY OF THE INVENTION

The main object of the present invention is to provide a synchronous common polar resonant wall type speaker cabinet which makes use of kinetic energy which will be vanished in the cabinet to drive one or more resonance means for synchronous oscillation to regenerate energy and emphasize the sound effect.

The second object of the present invention is to provide a synchronous common polar resonant wall type speaker cabinet to provide high quality bass effect without increasing of volume of speaker cabinet.

The third object of the present invention is to provide a synchronous common polar resonant wall type speaker cabinet to provide surrounding sound effect with only a speaker at low production cost, installation of which does not require skilled person in the art, and its installation can regenerate sound at high fidelity without distortion by mutual interference as in the case of narrow radiating sound fields from matrix speaker system.

The fourth object of the present invention is to provide a synchronous common polar resonant wall type speaker cabinet in the form of a simple structure which can be produced at relatively low cost and simple skill in mass production while its quality described above can be maintained.

The synchronous common polar resonant wall type speaker cabinet according to the present invention hence comprises a speaker fixed to its front board, and one or more resonance means on the other wall boards, in which each resonance means includes an air pressure compensation chamber surrounded by a rigid conductive hood, a compensation resonance chamber surrounded by a rigid wall board, a resonance plate between the air pressure compensation chamber and the compensation resonance chamber, a soft expansion gasket located between the rigid conductive hood and the resonance plate, and another soft expansion gasket between the resonance plate and the wall board so that the resonance plate can oscillate by changing of air pressure in the air pressure compensation chamber. When the speaker's conical part is oscillating outwards, there is a vacuum suction force in the cabinet to suck air from the air pressure compensation chamber to the interior space of the cabinet, and consequently the resonance plate turns about like a lever upon a pushing force from the rigid conductive hood. On the other hand, when the speaker's conical part is oscillating inwards, the resonance plate oscillates inwards. Hence a surrounding sound effect superior to that available from matrix speaker system is obtained with only a speaker without any increase of driving power.

BRIEF DESCRIPTION OF THE DRAWINGS

Further objects and advantages of the invention will be apparent from a reading of the following detailed description, taken in conjunction with the figures of the accompanying drawings, in which.

DETAILED DESCRIPTION OF THE PREFERRED EMBODIMENT

Figure 1:
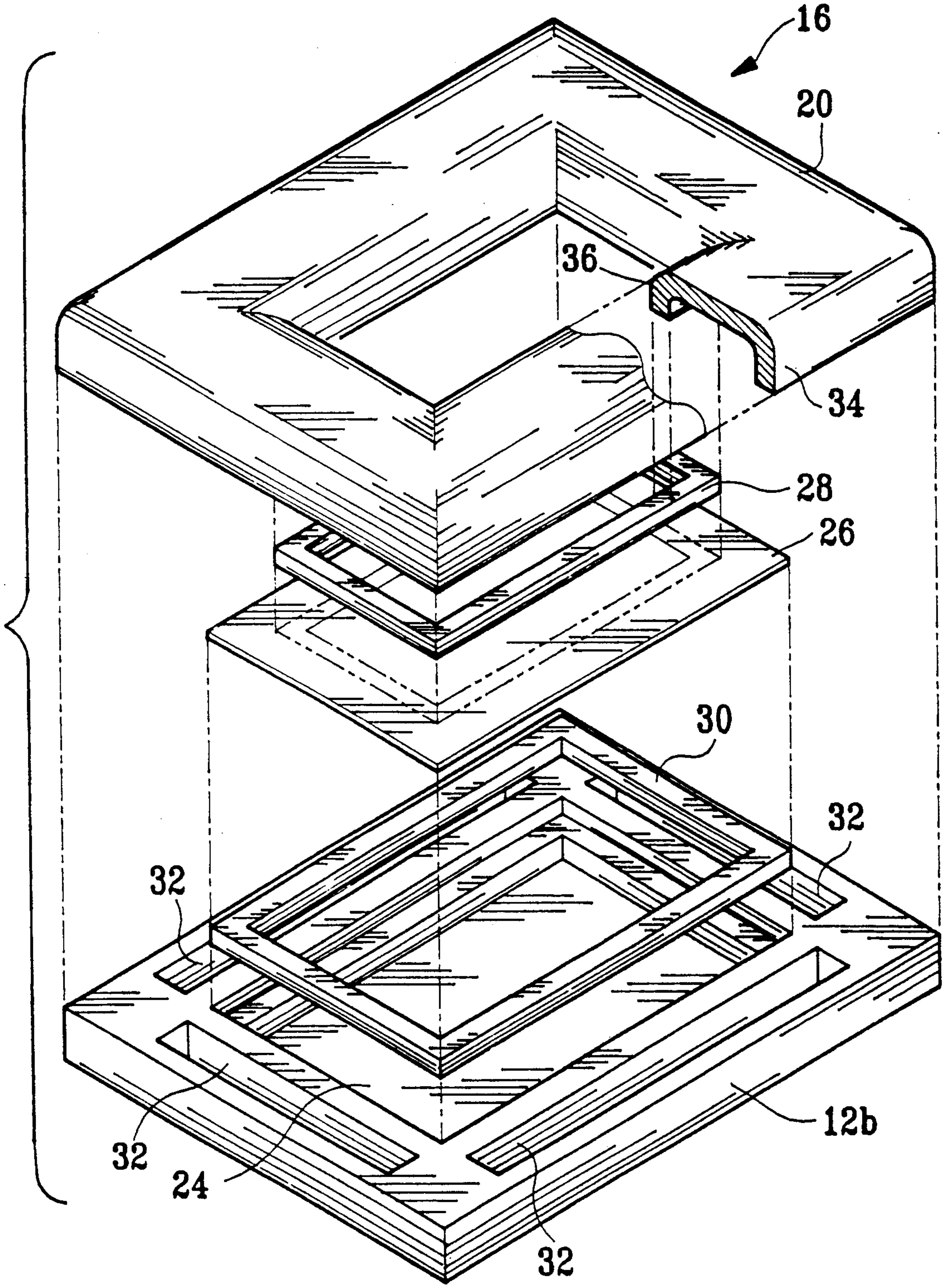
FIG. 1 is a perspective and fragmental view of a synchronous common polar resonance means according to the present invention.
Figure 2:
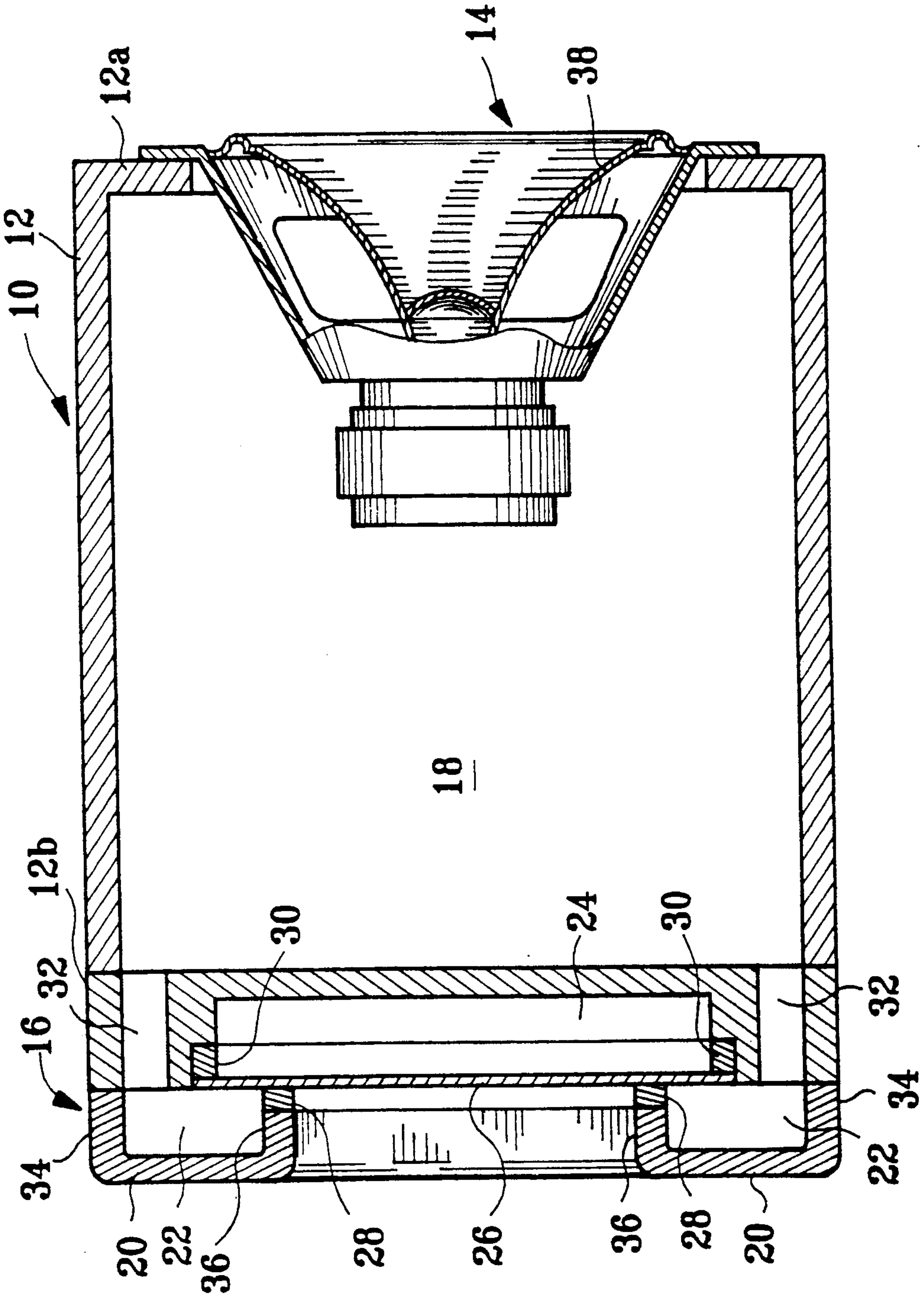
FIG. 2 is a longitudinal sectional view of the synchronous common polar resonance means according to the present invention as fixed in a speaker cabinet.

Please refer to FIGS. 1 and 2, the synchronous common polar resonant wall type speaker cabinet 10 according to the present invention comprises a frame 12 composed of a plurality of boards, a hi-fi speaker 14 which can convert electronic signals accurately received by electronic amplifier to radiative sound, and one or more synchronous common polar resonance means 16 placed on the boards except a front board 12*a*. The speaker 14 is fitted to the front board 12*a* of the frame 12. Though only a resonant means 16 is placed on a back board 12*b* shown in FIG. 2, as many resonance means 16 of the same type as necessary can be used to obtain a desirous tone. The interior space 18 surrounded by the boards is the main resonant cavity of the speaker 14.

The resonant means 16 comprises an annular air pressure compensation chamber 22 formed by a substantially U-like rigid conductive hood 20 arranged surrounding the back board 12*b*, a plurality of passage holes 32 around the back board 12*b* to connect the interior space 18 to the annular air pressure compensation chamber 22, an enclosed compensation resonant cavity 24 formed by a recession on the rigid back board 12*b*, a resonance plate 26 between the air pressure compensation chamber 22 and the compensation resonant cavity 24, a first soft expansion gasket 28 located between the resonance plate 26 and the rigid conductive hood 20, a second soft expansion gasket 30 between the resonance plate 26 and the wall board 12*b*, a long outer frame 34 and a short inner frame 36 for the rigid conductive hood 20. There is an appropriate distance between the first and the second expansion gaskets 28 and 30. The long external frame 34 is tightly, closely and seamlessly fixed to the outer edge of the back board 12*b*, and the short inner frame 36 is located around the resonance plate 26, and is tightly, closely and seamlessly fixed to the first expansion gasket 28. The resonance plate is designed to oscillate upon change of air pressure in the air pressure compensation chamber 22.

The rigid conductive hood and the rigid back board 12*b* are made of thin and rigid surface material, such as rigid plastic material by vacuum forming or injection molding. The resonance plate 28 is made of a light and high-strength material which is used to make the conical part for the speaker 14.

Upon receipt of electronic signals from an electronic amplifier, the conical part of the speaker 14 oscillates to generate a continuous sound wave which converts the electronic signal to radiative sound.

Figure 3:
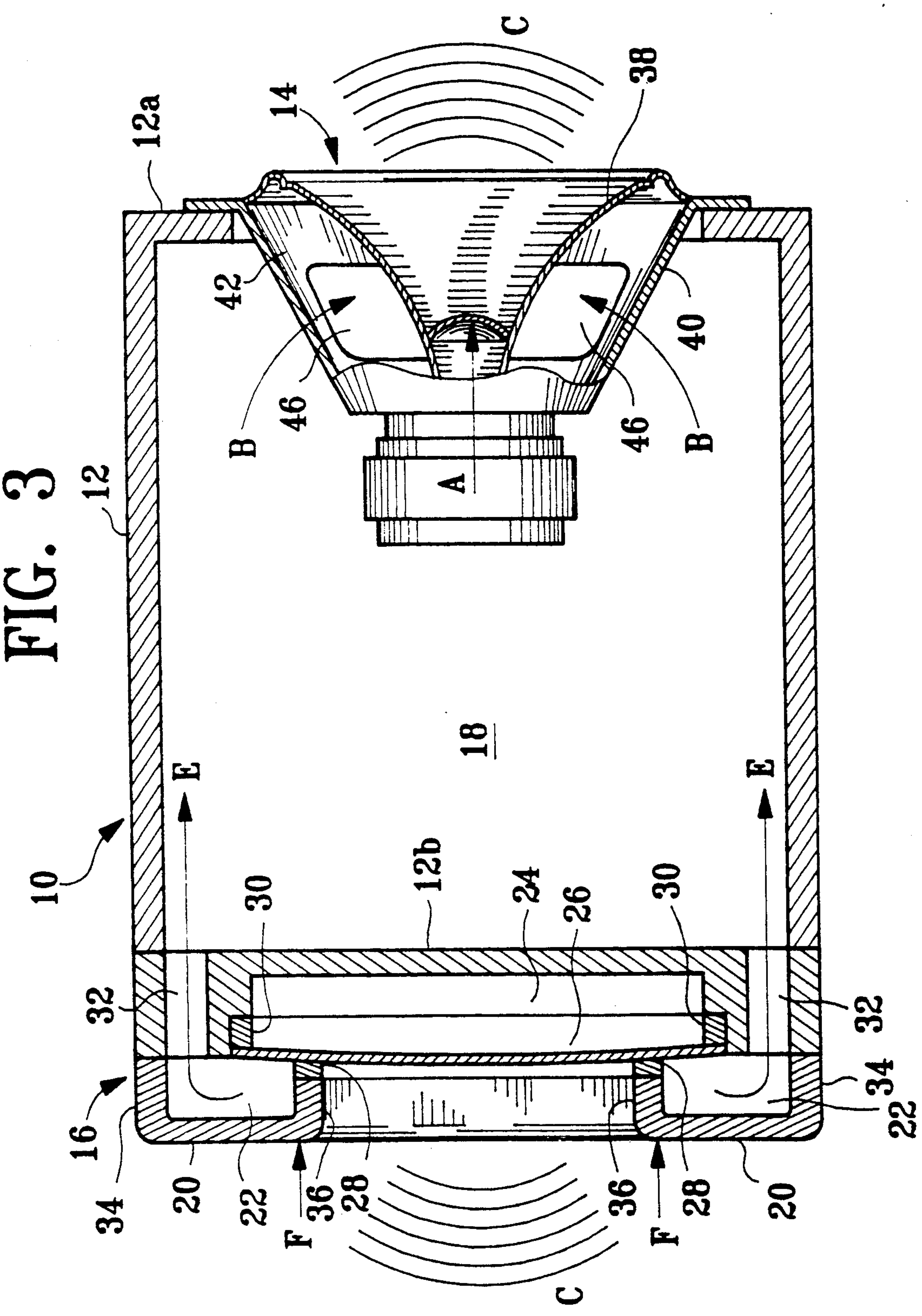
FIG. 3 is a longitudinal section view of the synchronous common polar resonance means according to the present invention as fixed in a speaker cabinet, illustrating outward oscillation of the resonance means and the speaker.

Please refer to FIG. 3, when the conical part 38 is oscillating outwards of the cabinet 10 in a direction as shown by an arrow A, the air outside the cabinet becomes denser in a zone designated as C. At the same time, the pressure in an interior space 42 between the conical part 38 and a speaker basket 40 is reduced because the conical part 38 is displacing outwards, consequently, air in the interior space 18 of the cabinet 10 flows into the interior space 42 of the speaker through a plurality of passage holes 46 formed on the speaker basket 40 in the directions as shown by the arrows B because of difference in air pressure, and the air in the annular air pressure compensation chamber 22 flows into the interior space 18 of the cabinet through the passage holes 32 in the direction shown by the arrows E because of difference in air pressure too. As described above, the rigid conductive hood 20 to form the annular air pressure compensation chamber 22 has a long outer frame 34 tightly and closely fixed to the back board 12*b* and a short inner frame 36 tightly and closely fixed to the first expansion gasket 28, when the pressure in the annular air pressure compensation chamber 22 is reduced due to outflowing of air, the short inner frame 36 of the rigid conductive hood displaces towards the inner side of the cabinet 10, and applies a vibratory force F to the first expansion gasket 28. Because the first expansion gasket 28 is substantially adhered to a rear end on the outer edge of the resonance plate 26, and maintains an appropriate distance from the second expansion gasket at a rear end on the inner edge of the resonance plate, the flexible and high-strength resonance plate 26 turns above the second expansion gasket 30 like a lever when it is subjected to the vibration force F from the first expansion gasket 28, consequently, the resonance plate 26 surrounded by the first expansion gasket 28 begins to oscillate outwards, and push the air outside the resonance plate 26 to become denser in a zone designated as C. In other words, when the conical part 38 is oscillating outwards, the resonance plate 26 in the synchronous common polar resonance means 16 is driven synchronously to oscillate outwards, and consequently the dense sound wave zones C of the same tone are obtained outside the front board 12*a* and the back board 12*b* of the cabinet simultaneously.

Figure 4:
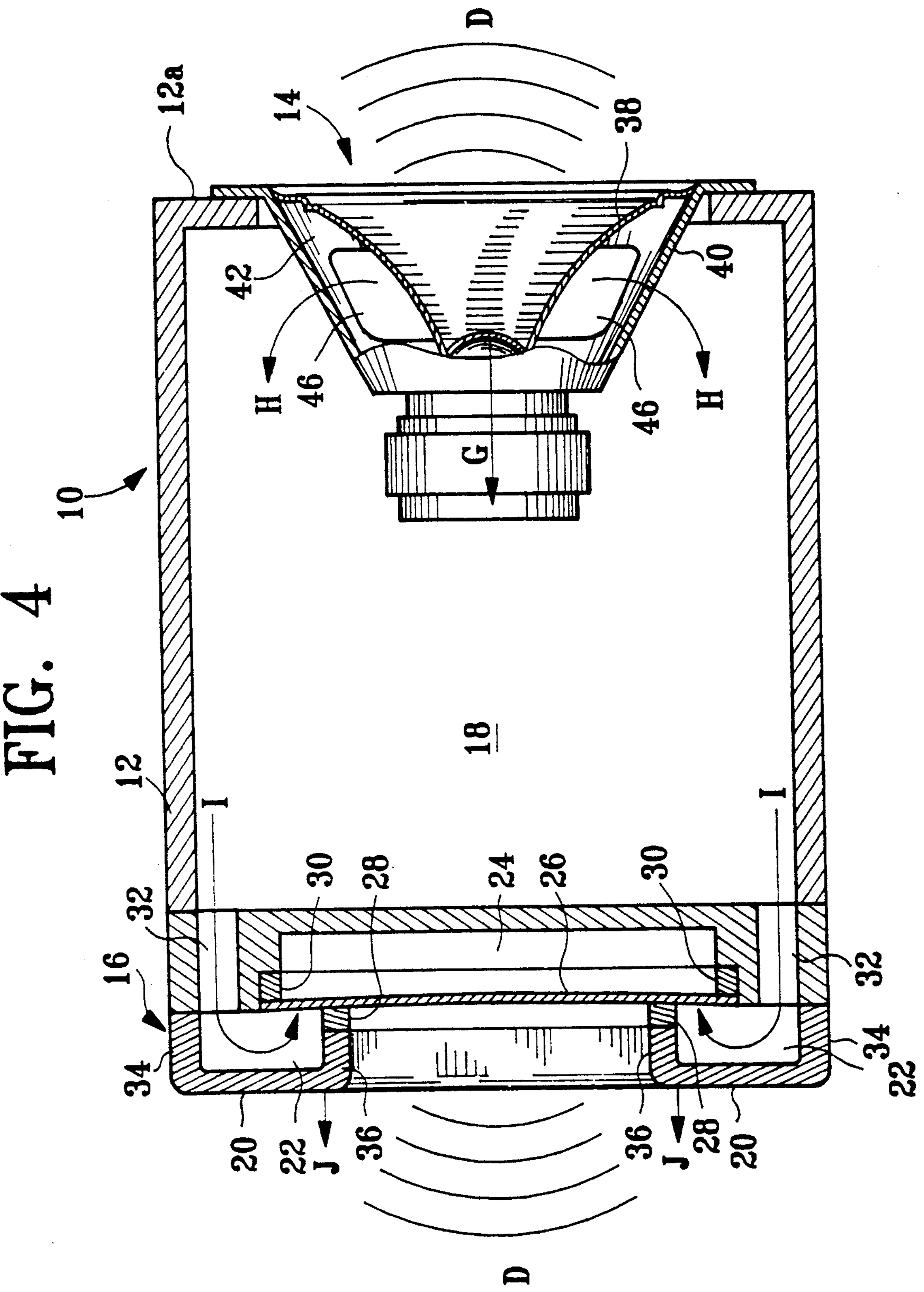
FIG. 4 is a longitudinal section view of the synchronous common polar resonance means according to the present invention as fixed in a speaker cabinet, illustrating inward oscillation of the resonance means and the speaker.

Please refer to FIG. 4, when the conical part 38 is oscillating inwards in a direction shown by an arrow G, the air density outside the cabinet 10 become loose in a zone designated as D because of falling down of air pressure, and, simultaneously, the air pressure in the interior space 42 of the speaker raises because the conical part 38 displaces inwards, consequently the air in the interior space 42 flows into the interior space 18 of the cabinet in the direction indicated by the arrows H because of difference in air pressure. In the same way, the air in the interior space 18 of the cabinet flows into the annular air pressure compensation chamber 22 in the direction shown by the arrows I because of difference in air pressure. Upon inflowing of air, the interior pressure in the annular air pressure compensation chamber 22 raises, the short inner frame 36 of the rigid conductive hood 20 displaces outwards in the direction indicated by the arrows J, then the flexible and high-strength resonance plate 26, which is surrounded by the first expansion gasket 28, turns above the second expansion gasket 30 like a lever, and oscillates inwards so that a loose sound wave zones D of the same tone are obtained outside the resonance plate 26.

As described above, when the conical part 38 of the speaker 14 is oscillating upon receipt of electronic signals from an electronic amplifier, the air pressure in the interior space 18 of the cabinet raises and falls alternately and repeatedly. In the conventional speaker cabinet, kinetic energy of air from the raise and fall of pressure in the interior space is absorbed by the rigid enclosed boards covering walls of the cabinet, and hence it is lost. In the present invention, the kinetic energy of air is utilized instead of its loss in the conventional speaker cabinet. It is used to drive at least a resonance means 16 fixed on partly hollow board of the cabinet to generate a radiative sound effect synchronous with the speaker 14. It does not only mean a recycling of energy, but a structure to provide high quality bass effect by increasing of resonance area without increase to the volume of speaker cabinet. Moreover, the resonance means and the speaker installed on the front board can provide synchronous and common polar sound waves respectively and simultaneously to generate the same, or even better surrounding sound effect available from the conventional matrix speaker system. In comparison with the conventional matrix speaker system, the present invention has a lot of merits such as lower production cost, easy to install. It can eliminate distortion due to mutual interference in narrow radiative sound field from the respective speakers, are generate hi-fi sound effect.

It will also be understood that while I have described a presently preferred embodiment of my invention in full detail, it will be obvious that my invention is not to be limited thereto or thereby, but only by that of the appended claims.

What is claimed is:

1. A synchronous common polar resonant wall type speaker cabinet comprising a cabinet composed of a plurality of resonance wall boards including a front board and at least a resonance means, forming a main resonance cavity inside the cabinet; and a front board and at least a speaker installed on the front board;

wherein each resonance means is composed of a rigid conductive hood, an annular air pressure compensation chamber surrounded by the rigid conductive hood and the resonance wall boards, at least a passage hole to connect the main resonance cavity to the annular air pressure compensation chamber, an enclosed compensation resonance cavity isolated from the main resonance cavity and the annular air pressure compensation chamber, a resonance plate having an outer edge between the air pressure compensation chamber and the compensation resonance chamber, a first soft expansion gasket located between the resonance plate and the rigid conductive hood, and a second soft expansion gasket between the resonance plate and the wall board and maintained an appropriate distance from the first soft expansion gasket;

whereby a compensation air flow between the air pressure compensation chamber and the main resonance cavity can provide a kinetic energy to drive the resonance means for a synchronous and common polar oscillation synchronous with the speaker.

2. A synchronous common polar resonant wall type speaker cabinet as claimed in claim 1 wherein the rigid conductive hood has a substantially U-like cross section, a long external frame tightly, closely and seamlessly fixed to the outer edge of the resonance plate, and a short inner frame located around the resonance plate, tightly, closely and seamlessly fixed to the first expansion gasket.

* * * * *